United States Patent
Ashizawa

(10) Patent No.: US 8,283,837 B2
(45) Date of Patent: Oct. 9, 2012

(54) PIEZOELECTRIC ACTUATOR, PIEZOELECTRIC ACTUATOR DEVICE, LENS BARREL, OPTICAL DEVICE AND MANUFACTURING METHOD THEREOF

(75) Inventor: Takatoshi Ashizawa, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/153,163

(22) Filed: May 14, 2008

(65) Prior Publication Data
US 2009/0001852 A1 Jan. 1, 2009

(30) Foreign Application Priority Data

May 17, 2007 (JP) ................................ 2007-131830

(51) Int. Cl.
*H01L 41/08* (2006.01)
(52) U.S. Cl. .................................................. 310/323.02
(58) Field of Classification Search ............. 310/323.02, 310/328
See application file for complete search history.

(56) References Cited

U.S. PATENT DOCUMENTS

| | | | | |
|---|---|---|---|---|
| 3,902,084 A | * | 8/1975 | May, Jr. ......................... | 310/328 |
| 3,902,085 A | * | 8/1975 | Bizzigotti ...................... | 310/328 |
| 4,219,755 A | * | 8/1980 | O'Neill et al. ................. | 310/348 |
| 4,570,096 A | * | 2/1986 | Hara et al. ..................... | 310/328 |
| 4,874,979 A | * | 10/1989 | Rapp ............................. | 310/328 |
| 5,027,027 A | * | 6/1991 | Orbach et al. ................. | 310/317 |
| 2005/0035687 A1 | * | 2/2005 | Xu et al. ........................ | 310/328 |

FOREIGN PATENT DOCUMENTS

JP    A-55-100059    7/1980

* cited by examiner

*Primary Examiner* — Mark Budd
(74) *Attorney, Agent, or Firm* — Oliff & Berridge, PLC

(57) ABSTRACT

A piezoelectric actuator comprises a first piezoelectric element pre-polarized towards a first direction and displaceable towards an about orthogonal direction with respect to said first direction, a second piezoelectric element pre-polarized towards a direction about parallel to the first direction and displaceable towards a direction about parallel to said first direction, a relative moving member clamped by displacement of said first piezoelectric element and relatively moves by displacement of said second piezoelectric element.

28 Claims, 8 Drawing Sheets

(A)

(B)

(A)

(B)

(C)

(D)

PIEZOELECTRIC ACTUATOR, PIEZOELECTRIC ACTUATOR DEVICE, LENS BARREL, OPTICAL DEVICE AND MANUFACTURING METHOD THEREOF

BACKGROUND OF THE INVENTION

1. Field of the Invention

The present invention relates to a piezoelectric actuator which is available to obtain mechanical displacement by displacement of piezoelectric element.

2. Description of the Related Art

Presently, as a piezoelectric actuator, a rotation type represented by a type using progressive oscillating wave and a linear type represented by a type having clamping mechanism are known. The rotation type and the linear type are properly used depend on motion track, size, accuracy requirement and the like of a member which is a driven object. A linear type piezoelectric actuator can be used as a driving source for any members acting linear motion particularly, it is preferable, for example, a lens barrel with lenses which linearly moves in a body tube for auto focusing.

As a linear type piezoelectric actuator according to conventional art, for example, it is known described in JP Patent Publication No. 55-100059. Such the linear type piezoelectric actuator with respect to the conventional art comprises a structure to hold a first to a third stacked piezoelectric elements as H-shape by a pair of T-shaped cross-sectional supporting member. Said linear type actuator is that first stacked type piezoelectric elements are stacked towards moving direction which are available to expansion, contrary this, second piezoelectric elements and third piezoelectric elements are stacked toward a direction orthogonal to said moving direction which are available to expansion towards said orthogonal direction. Said linear type actuator can back and forth movement on a guide rail by acting looping movement according to expansion the first stacked type piezoelectric elements with clamping the guide rail by the second or the third stacked type piezoelectric elements.

However, there is a problem that the piezoelectric actuator according to the above conventional art is difficult to minimize its size due to complexity of its shape and mechanism. Also, stacking directions of the respective piezoelectric elements are orthogonal respectively adds complexity wiring, at this point, it is hard to minimize.

SUMMARY OF THE INVENTION

An object of the present invention is to solve such problems and to provide a piezoelectric actuator with simple structure and minimized size.

In order to achieve the above purpose, a piezoelectric actuator comprises, a first piezoelectric element pre-polarized along a first direction and displaceable along a direction substantially perpendicular to said first direction;

a second piezoelectric element pre-polarized along a direction substantially parallel to said first direction and displaceable along a direction substantially parallel to said first direction; and a relative moving member clamped by displacement of said first piezoelectric element and relatively moves by displacement of said second piezoelectric element.

Also, for example, said first piezoelectric element and said second piezoelectric element may be integrally layered along said first direction via electrodes.

Also, for example, said relative moving member may move relatively along a direction substantially parallel to said first direction.

Also, for example, said first piezoelectric element and said second piezoelectric element may have annular disc shape, said relative moving member is provided in a hollow part of said annular disc shape, said first direction is a direction perpendicular to a radial direction of said annular disc shape.

Also, for example, the piezoelectric actuator according to the present invention may comprise;

a driving signal controlling portion connected with said first piezoelectric element and said second piezoelectric element to output driving signals to said first piezoelectric element and said second piezoelectric element, wherein;

said driving signal controlling portion outputs said driving signal to control so as to move said relative movement member by displacing said second piezoelectric element with a status of clamping said relative moving member by displacing said first piezoelectric element.

Also, for example, the piezoelectric actuator according to the present invention may comprise, a driving signal controlling portion connected with said first piezoelectric element and said second piezoelectric element to output driving signals to said first piezoelectric element and said second piezoelectric element, wherein;

said driving signal controlling portion outputs a first driving signal for clamping said relative moving member by displacing said first piezoelectric element, and a second driving signal for moving said relative moving member by displacing said second piezoelectric element, and said first driving signal and phase of said second driving signal are different in phases.

Also, for example, the piezoelectric actuator according to the present invention may be that said first driving signal and said second driving signal have equal frequency.

Also, for example, said first piezoelectric element and said second piezoelectric element may be located side by side along said first direction.

Also, for example, the piezoelectric actuator according to the present invention may comprise a supporting portion to support said second piezoelectric element, wherein;

said relative moving member relatively moves to said supporting portion by displacement of said second piezoelectric element.

Also, for example, the piezoelectric actuator according to the present invention may comprise a third piezoelectric element provided in the same row along said first direction opposite to said first piezoelectric element with respect to said second piezoelectric element, wherein, said third piezoelectric element is pre-polarized along the first direction and displaceable along a direction substantially perpendicular to said first direction.

Also, for example, the piezoelectric actuator according to the present invention may comprise a driving signal controlling portion which outputs driving signals to said first piezoelectric element, said second piezoelectric element and said third piezoelectric element, wherein;

said driving signal controlling portion continuously operates controlling to move said relative movement member by displacing said second piezoelectric element with a status of clamping said relative moving member by displacing said first piezoelectric element, and to displace said second piezoelectric element with a status of clamping said relative moving member by displacing said third piezoelectric element.

Also, for example, the piezoelectric actuator according to the present invention may comprise a driving signal controlling portion which outputs driving signals to said first piezoelectric element, said second piezoelectric element and said third piezoelectric element, wherein;

said driving signal controlling portion outputs a first driving signal for clamping said relative moving member by displacing said first piezoelectric element, a second driving signal for moving said relative moving member by displacing said second piezoelectric element and a third driving signal for clamping said relative moving member by displacing said third piezoelectric element, and said first driving signal, phase of said second driving signal and said third driving signal are different in phases, respectively.

Also, for example, the piezoelectric actuator according to the present invention may be that said first driving signal, said second driving signal and said third driving signal have equal frequency.

Also, for example, the piezoelectric actuator according to the present invention may comprise a supporting portion to support said third piezoelectric element, wherein;

said relative moving member relatively moves to said supporting portion by displacement of said second piezoelectric element.

Also, for example, the piezoelectric actuator according to the present invention may comprise;

displacement amount of said first piezoelectric element along a direction substantially perpendicular to said first direction is larger than that along said first direction, a displacement amount of said second piezoelectric element along said first direction is larger than that along a direction substantially perpendicular to said first direction.

Also, for example, the piezoelectric actuator according to the present invention may comprise;

displacement amounts of said first piezoelectric element and said third piezoelectric element along a direction substantially perpendicular to said first direction are larger than that along said first direction, a displace amount of said second piezoelectric element along said first direction is larger than that along a direction substantially perpendicular to said first direction.

A piezoelectric actuator device according to the present invention comprises a plurality of piezoelectric actuators as any one of the above mentioned;

a first driving signal generating portion which outputs a first driving signal to a first piezoelectric actuator among said plurality of piezoelectric actuators; and a second driving signal generating portion which outputs a second driving signal to a second piezoelectric actuator among said plurality of piezoelectric actuators.

Also, for example, said first driving signal and said second driving signal may be equal in frequency, at least one of said first driving signal generating portion and said second driving signal generating portion may be available to make different voltage levels of said first driving signal and said second driving signal.

A lens barrel according to the present invention comprises the piezoelectric actuator as any of the above mentioned, and a lens which moves in response to a relative movement of said relative moving member.

Also, for example, said lens may move along an identical direction of movement of said relative moving member.

An optical equipment according to the present invention comprises the piezoelectric actuator as any one of the above mentioned, and an optical member which moves in response to relative movement of said relative moving member.

Also said optical member may move along an identical direction of moving direction of said relative movable member.

A method for manufacturing a piezoelectric actuator according to the present invention comprises;

providing a first piezoelectric element pre-polarized along a first direction, displaceable along a direction substantially perpendicular to said first direction;

providing a second piezoelectric element pre-polarized along a direction substantially parallel to the first direction, displaceable along a direction substantially parallel to said first direction; and providing a relative moving member clamped by displacement of said first piezoelectric element and relatively movable by displacement of said second piezoelectric element.

Also, for example, the method for manufacturing the piezoelectric actuator according to the present invention may comprise, said first piezoelectric element and said second piezoelectric elements are stacked integrally along said first direction via electrodes.

Also, for example, the method for manufacturing the piezoelectric actuator according to the present invention may comprise, providing said relative moving member so as to move relatively along a direction substantially parallel to said first direction.

Also, for example, the method for manufacturing the piezoelectric actuator according to the present invention may comprise, said first piezoelectric element and said second piezoelectric element have annular disc shape, said relative moving member provided in a hollow part of said annular disc shape, and said first direction is a direction perpendicular to a radial direction of said annular disc shape.

Also, for example, the method for manufacturing the piezoelectric actuator according to the present invention may comprise, providing a driving signal controlling portion which outputs driving signal to said first piezoelectric element and said second piezoelectric element, wherein;

said driving signal controlling portion controls so as to move said relative movement member by displacing said second piezoelectric element with a status of clamping said relative moving member by displacing said first piezoelectric element.

Also, for example, the method for manufacturing the piezoelectric actuator according to the present invention may comprise, providing a driving signal controlling portion which outputs driving signal to said first piezoelectric element and said second piezoelectric element, wherein;

said driving signal controlling portion outputs a first driving signal for clamping said relative moving member by displacing said first piezoelectric element, and a second driving signal for moving said relative moving member by displacing said second piezoelectric element, and said first driving signal and said second driving signal are different in phases.

Also, for example, the method for manufacturing the piezoelectric actuator according to the present invention may comprise, said first driving signal and said second driving signal are equal in frequency.

Also, for example, the method for manufacturing the piezoelectric actuator according to the present invention may comprise, said first piezoelectric element and said second piezoelectric element are located side by side along said first direction.

Also, for example, the method for manufacturing the piezoelectric actuator according to the present invention may comprise, providing a supporting portion to support said second piezoelectric element, and providing relative moving member so as to move relatively with said supporting portion by displacement of said second piezoelectric element.

Also, for example, the method for manufacturing the piezoelectric actuator according to the present invention may comprise, providing a third piezoelectric element in juxtaposition along with said first direction opposite to said first piezoelectric element with respect to said second piezoelectric element, wherein;

said third piezoelectric element is pre-polarized along a first direction and is displaceable along a direction substantially perpendicular to said first direction.

Also, for example, the method for manufacturing the piezoelectric actuator according to the present invention may comprise, providing a driving signal controlling portion to output driving signals to said first piezoelectric element, said second piezoelectric element and said third piezoelectric element, wherein;

said driving signal controlling portion controls so as to move said relative movement member by displacing said second piezoelectric element with a status of clamping said relative moving member by displacing said first piezoelectric element, and continuously controls so as to displace said second piezoelectric element with a status of clamping said relative moving member by displacing said third piezoelectric element.

Also, for example, the method for manufacturing the piezoelectric actuator according to the present invention may comprise, providing a driving signal controlling portion which outputs driving signals to said first piezoelectric element, said second piezoelectric element and said third piezoelectric element, wherein;

said driving signal controlling portion outputs a first driving signal for clamping said relative moving member by displacing said first piezoelectric element, a second driving signal for moving said relative moving member by displacing said second piezoelectric element and a third driving signal for clamping said relative moving member by displacing said third piezoelectric element, and said first driving signal, said second driving signal and said third driving signal are different in phases, respectively.

Also, for example, the method for manufacturing the piezoelectric actuator according to the present invention may comprise, said first driving signal, said second driving signal and said third driving signal are equal frequency.

Also, for example, the method for manufacturing the piezoelectric actuator according to the present invention may comprise, providing a supporting portion to support said third piezoelectric element, and said relative moving member is provided so as to relatively move to said supporting portion by displacement of said second piezoelectric element.

Also, for example, the method for manufacturing the piezoelectric actuator according to the present invention may comprise, a displacement amount of said first piezoelectric element along a direction substantially perpendicular to said first direction is larger than that along said first direction, and a displacement amount of said second piezoelectric element along said first direction is larger than that along a direction substantially perpendicular to said first direction.

Also, for example, the method for manufacturing the piezoelectric actuator according to the present invention may comprise, displacement amounts of said first piezoelectric element and said third piezoelectric element along a direction substantially perpendicular to said first direction are larger than that along said first direction, and a displace amount of said second piezoelectric element along said first direction is larger than a direction substantially perpendicular to said first direction.

A method for manufacturing piezoelectric actuator device according to the present invention comprises;

providing a plurality of piezoelectric actuators as set forth in any one of the above mentioned;

providing a first driving signal generating portion to output a first driving signal to a first piezoelectric actuator among said plurality of piezoelectric actuators; and providing a second driving signal generating portion to output a second driving signal to a second piezoelectric actuator of said plurality of piezoelectric actuators.

Also, for example, the method for manufacturing piezoelectric actuator device according to the present invention may comprise, said first driving signal and said second driving signal are equal in frequency, at least one of said first driving signal generating portion and said second driving signal generating portion is available to make different voltage levels of said first driving signal and said second driving signal.

A method for manufacturing lens barrel according to the present invention comprises;

providing a piezoelectric actuator as any one of the above described, providing a lens which moves in response to a relative movement of said relative moving member.

Also, for example, the method for manufacturing lens barrel according to the present invention may comprise, said lens moves along an identical direction of movement of said relative moving member.

A method for manufacturing optical equipment according to the present invention comprises;

providing a piezoelectric actuator as any one of the above described, providing an optical member which moves in response to a relative movement of said relative moving member.

Also, for example, the method for manufacturing optical equipment according to the present invention may comprise, said lens moves along an identical direction of movement of said relative moving member.

BRIEF DESCRIPTION OF THE DRAWINGS

Below, the present invention will explained based on embodiments shown in drawings.

DESCRIPTION OF THE PREFERRED EMBODIMENTS

First Embodiment

Below, embodiments of a piezoelectric actuator according to the present invention are explained with reference to accompanying drawings.

Figure 1:
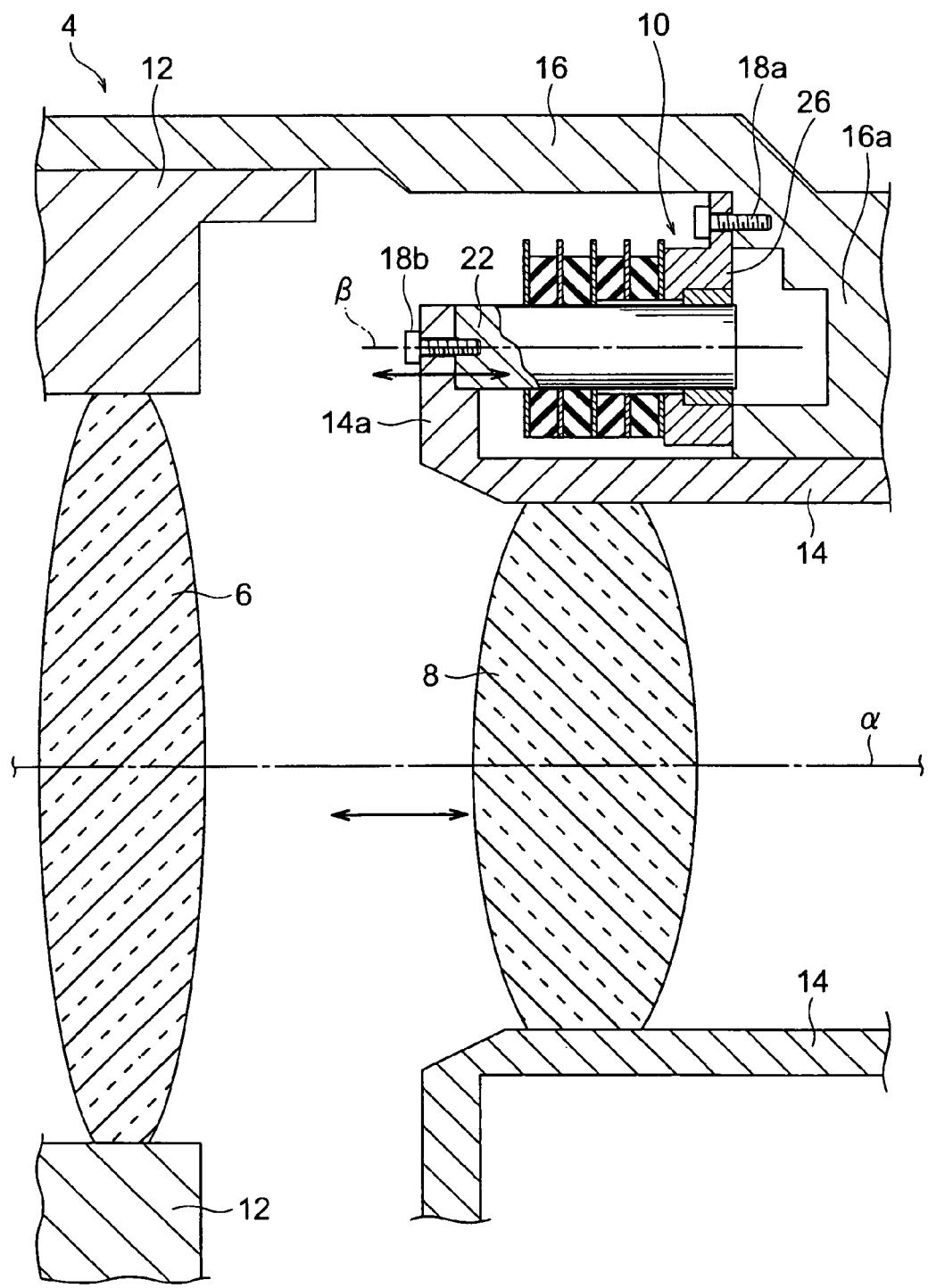
FIG. 1 is a cross sectional view of a main section of a lens barrel comprising a piezoelectric actuator according to one embodiment of the present invention.

FIG. 1 is a drawing to explain a piezoelectric actuator 10 according to a first embodiment of the present invention, and a cross sectional view along an optical axis direction α of a lens barrel 4 to which the piezoelectric actuator 10 is equipped. In the vicinity of a center proton of the lens barrel 4, lens 6 and AF (auto-focal) adjust lens 8 are provided. The lens 6 is fixed on a lens holding frame 12, the holding frame 12 is located movably along an optical axis direction α of the lens 6 with respect to a fixing cylinder 16. An AF adjust lens 8 is fixed on an AF annulus 14. The AF annulus 14 is located movable along the optical axis α direction with respect to the fixing cylinder 16. The piezoelectric actuator 10 is fixed at a position where a peripheral side of the AF annulus 14 and an inner peripheral side of the fixing cylinder 16.

A supporting portion 26 of the piezoelectric actuator 10 is fixed to a locating portion 16a of the fixing cylinder 16 by a bolt 18a. An output rod 22 of the piezoelectric actuator 10 is fixed to a connecting portion 14a, which is an end portion of the AF annulus with respect to the optical axis α direction, to which the AF adjust lens 8 is equipped, by a bolt 18b so that a shaft core β direction of the rod becomes about in parallel to the optical axis α. Against the supporting portion 26, when the output rod 22 is driven along the shaft core β direction, following thereof, the AF annulus 14 is moved along the optical axis α direction.

FIG. 2(A) is an enlarged cross sectional view of the piezoelectric actuator 10 of a first embodiment. The piezoelectric actuator 10 according to the present embodiment comprises the supporting portion 26, a driving portion 24, a bush 28 and the output rod 22, each of these members are arranged with respect to the shaft core β, which is about parallel to the optical axis α, as a center. The driving portion 24 is attached to the supporting portion 26, which is to fix the piezoelectric actuator 10 to the fixing cylinder 16, in the vicinity of the shaft core β. The supporting portion 26 and the driving portion 24 have annular disc shape, the output rod 22 penetrates in hollowing portions. The output rod 22 has a cylindrical shape having a diameter which is about identical to an inner diameter of the bush 28 is located movable to a direction along the shaft core β.

The supporting portion 26 supports the whole piezoelectric actuator 10 including the driving portion 24 and the output rod 22, and holes 30 for screw fixation to fix the piezoelectric actuator 10 to the fixing cylinder 16 are provided at two to four position. The bush 28 provided between the supporting portion and the output rod 22 performs as a bearing so as to move the output rod 22 to the shaft core β direction with low friction with positioning the output rod 22 at a radial direction.

The output rod 22 is driven progressively along the shaft core β direction by repeating clamping and expansion movement by the driving portion 24. The output rod 22 and clamping piezoelectric elements 36, 38 are positioned so that a circumference surface 22a of the output rod 22 is contacted or spaced to the inner circumference surfaces 36a, 38a of the clamping piezoelectric elements 36, 38 by voltage controlling to the piezoelectric actuator 10. Contrary this, the output rod 22 and driving piezoelectric elements 40, 42 are designed so as not to contact each other, in spite of the voltage controlling to the piezoelectric actuator 10.

The driving portion 24 of the piezoelectric actuator 10 is constituted that 6 sheets of electrodes and four sheets of piezoelectric elements are mutually stacked along the shaft core β direction. As shown in FIG. 2(B), the four sheets of piezoelectric elements 36 to 42 have annular disc shape, silver electrodes are formed on both adverse and reverse faces.

As shown in FIG. 2(A), the driving portion 24 consists of clamping piezoelectric element portion 32 for clamping and releasing the output rod 22 and a driving piezoelectric element portion 34 to relatively move the output rod 22 along an axis direction, and being stacking structure comprising two sheets of piezoelectric elements, respectively. The driving piezoelectric element portion 34 and the clamping piezoelectric element portion 32 are arranged along an edge direction β1 along the shaft core β of the output rod 22 against the supporting portion 26 in this sequence.

As shown in FIG. 2(A), the clamping piezoelectric element portion 32 comprises the piezoelectric element 36 and the piezoelectric element 38 which are pre-polarized to a direction toward an electrode 48 provided at a center along the shaft core β direction from an electrodes 46, 50 provided both side of the electrode 48 along the shaft core β direction. Namely, in the present embodiment, the clamping piezoelectric element portion 32 is pre-polarized to both directions (a top end direction β1 and a base end direction β2 of the shaft core β), along with the shaft core β which is about in parallel to the optical direction α. Each of the piezoelectric elements 36, 38 of the clamping piezoelectric element portion 32 are alternately coupled with electrodes 46, 48, 50 and are arranged so that the pre-polarized directions are facing each other.

The electrode 48 arranged at the center portion of the clamping piezoelectric element 32 along the shaft core β direction is connected with an A-phase signal output portion of a driving signal generating portion 60 of a driving apparatus 56, and the A-phase driving signal is input. Also, the electrodes 46, 50 provided at both sides of the electrode 48 along the shaft core β direction are grounded.

As shown by arrows in FIG. 2(A), a driving piezoelectric element portion 34 is pre-polarized towards from an electrode 52 at a center portion along the shaft core β direction to a direction towards electrodes 50, 54 arranged at both sides. The driving piezoelectric element portion 34 is pre-polarized to a direction about in parallel to the pre-polarized direction of the clamping piezoelectric element portion 32, namely, to both directions (a top end direction β1 and a base end direction β2 of the shaft core β), along with the shaft core β which is about in parallel to the optical direction α. Each of the piezoelectric elements 40, 42 of the driving piezoelectric element portion 34 are alternately coupled with electrodes 50, 52, 54 and are arranged so that the pre-polarized directions are back to back each other.

The electrode 52 arranged at the center portion of the driving piezoelectric element 34 along the shaft core β direction is connected with a B-phase signal output portion of a driving signal generating portion 60 of a driving apparatus 56, and the B-phase driving signal is input. Also, the electrodes 50, 54 provided at both sides of the electrode 52 along the shaft core β direction are grounded. In the present embodiment, an electrode at a connecting portion of the clamping piezoelectric element portion 32 and the driving piezoelectric element portion 34 is consisted of one sheet of common electrode 50.

The driving apparatus 56 generates a driving signal to drive the piezoelectric actuator 10, and outputs to the electrodes 48 and 52 of the piezoelectric actuator 10. The driving apparatus 56 consists of a controlling portion 57, an oscillating portion 58, a position detecting portion 59, a driving signal generating portion 60.

The controlling portion 57 controls the oscillating portion 58 and the driving signal generating portion 60. The oscillating portion 58 generates a predetermined constant frequency driving signal by a command from the controlling portion 57. The driving signal generating portion 60 inputs a driving signal from the oscillating portion 58 and generates and outputs two driving signal whose phases are different. Although the phases of these two driving signals are different, frequencies are an identical. In the present embodiment, these driving signals are called as an A-phase driving signal and a B-phase driving signal. The A-phase driving signal is output to the electrode 48 of the piezoelectric actuator and is used as a driving signal for driving the clamping piezoelectric element portion 32. Also, the B-phase driving signal is output to the electrode 52 of the piezoelectric actuator and is used as a driving signal for driving the driving piezoelectric element portion 34.

The position detecting portion 59 consists of a linear type encoder (optical type encoder or magnetic encoder) and the like, and detects a position and velocity of the output rod 22 along the optical axis α direction (or a position of the shaft core β direction). The detected signal is output to the controlling portion 57. The controlling portion 57 obtains positional information and a velocity information from the detected signal thereof, and controls the output of the driving signal so that the output rod 22 can be positioned at a target position.

Figure 3:
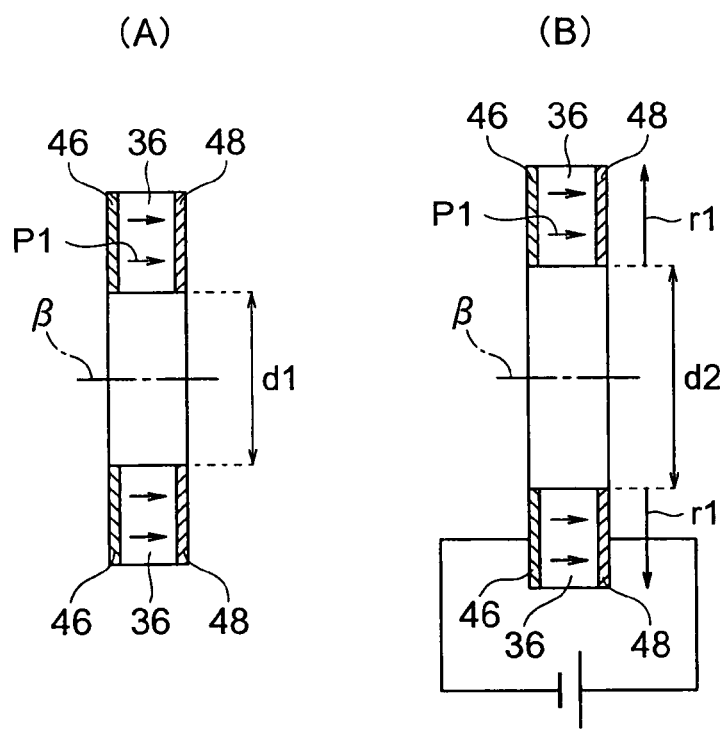
FIG. 3 is schematic views explaining relation of pre-polarize direction and displacement direction of a piezoelectric actuator according to a first embodiment of the present invention.
Figure 3:
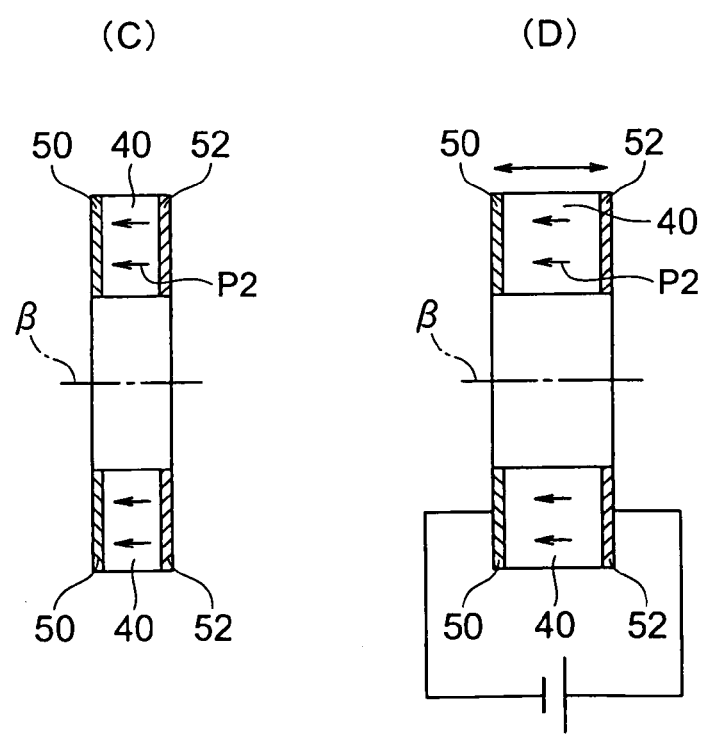

FIG. 3(A) is an enlarge drawing of one portion of the clamping piezoelectric element portion 32 and a cross sectional view including the shaft core β. Arrows of FIG. 3(A) show a pre-polarize direction P1 of a piezoelectric element 36. As shown in FIG. 3(B), when a voltage is applied to the piezoelectric element 36 of the clamping piezoelectric element portion 32 to a direction opposite to the pre-polarize direction P1, a displacement occurs which elongates toward an outer side of a radial direction (arrow r1 direction) which is perpendicular with the pre-polarize direction P1 as the shaft core β is a center. Namely, the clamping piezoelectric element portion 32 in the present embodiment utilizes piezoelectric effect of d31 mainly, the clamping piezoelectric element portion 32 comprises a property which liable to elongate and contract (namely, large displacement property) towards a direction perpendicular to the pre-polarize direction P1 than a direction in parallel to the pre-polarize direction P1.

A diameter of a follow portion of the clamping piezoelectric element portion 32 is designed to vary from a diameter d1 which is an identical with or less than a diameter of the output rod 22 to a diameter d2 which exceeds the diameter of the output rod 22 by the above mentioned piezoelectric effect.

FIG. 3(B) is an enlarge drawing of one portion of the driving piezoelectric element portion 34 and a cross sectional view including the shaft core β. Arrows of FIG. 3(C), as similar to FIG. 3(A), show a pre-polarize direction P2 of a piezoelectric element 40. As shown in FIG. 3(D), when a voltage is applied to the driving piezoelectric element portion 34 to a direction conform to the pre-polarize direction P2, a displacement occurs which elongates to the shaft center β direction. Namely, the clamping piezoelectric element portion 34 in the present embodiment utilizes piezoelectric effect of d33 mainly, the clamping piezoelectric element portion 34 comprises a property which liable to elongate and contract (namely, large displacement property) towards a direction perpendicular to the pre-polarize direction P2 than a direction in parallel to the pre-polarize direction P2.

Figure 4:
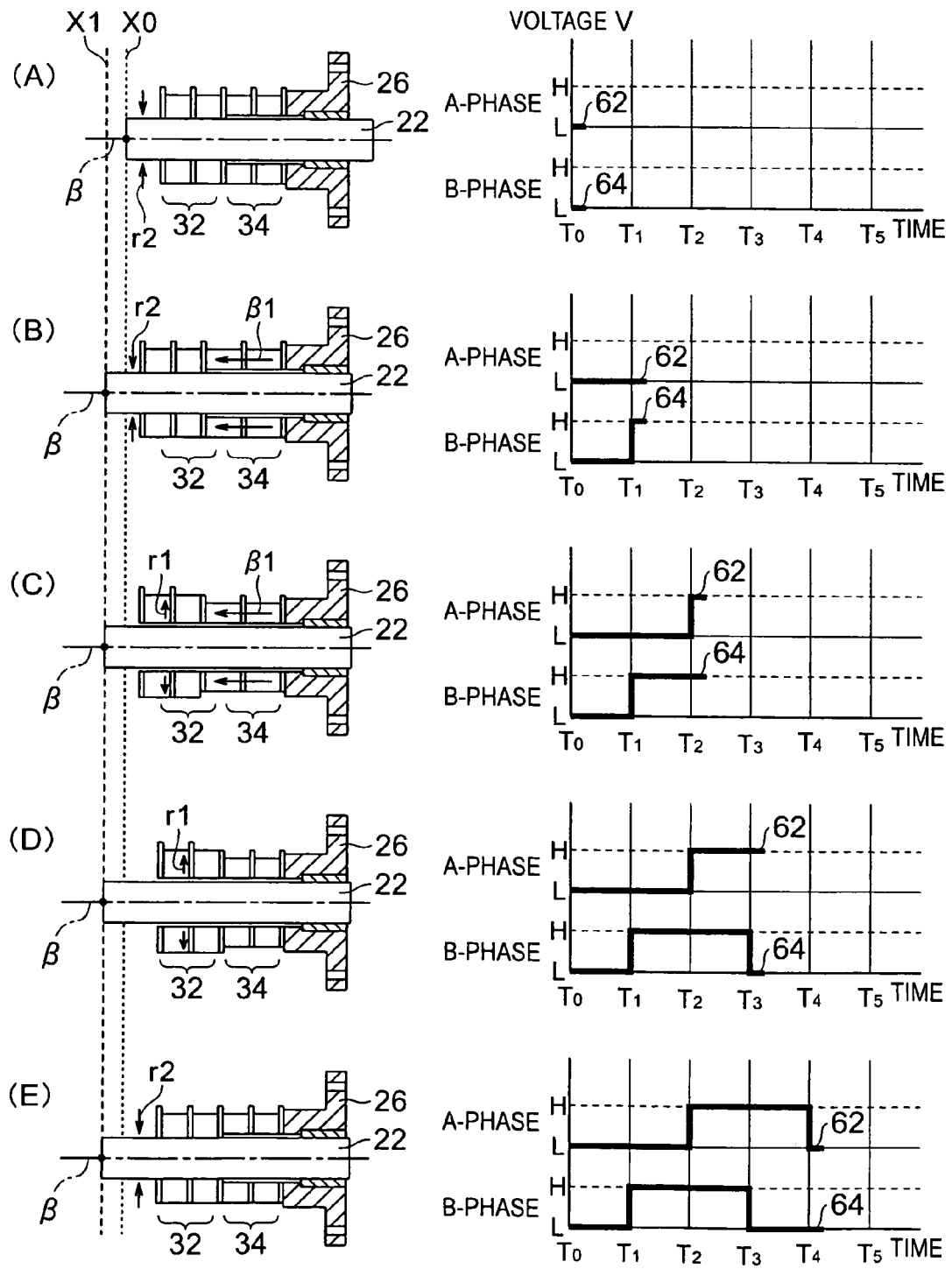
FIG. 4 is schematic views showing one example of controlling by driving signal of a piezoelectric actuator according to a first embodiment of the present invention.

FIG. 4 is a drawing to explain a driving principle of the piezoelectric actuator 10 according to the first embodiment. By two driving signal from the driving apparatus 56 whose phases are different, namely, by the A-phase driving signal and the B-phase driving signal, the piezoelectric actuator 10 is driven as follows. Driving signals input to each piezoelectric element portions and movement of the output rod 22 will be specified in each step (A) to (E). Each step (A) to (E) corresponds to FIG. 4(A) to FIG. 4(E).

Step (A)

As shown in FIG. 4(A), the A-phase driving signal 62 is a low level voltage value L (0V) status, the B-phase driving signal 64 is a low level voltage value L (0V) status, and both are initial conditions. The clamping piezoelectric element portion 32, to which the A-phase driving signal 62 is applied, displaces to an inner side of radial direction (arrow r2 direction), and being a status of clamping the output rod 22. The driving piezoelectric element portion 34, to which the B-phase driving signal 64 is applied, is a status that a displacement is not occurred. Therefore, a tip end of the output rod 22 is fixed by the clamping piezoelectric element portion and is not driven and stayed at the initial position X0. During a time T0 to a time T1, a condition shown in FIG. 4(A) continues.

Step (B)

After a status of FIG. 4(A), as shown in FIG. 4(B), although the A-phase driving signal 62 is the low level voltage value L (0V), the B-phase driving signal 64 becomes a high level voltage value H (predetermined positive voltage) status. The clamping piezoelectric element portion 32, to which the A-phase driving signal 62 is added, is in a status which is displaced to the inner side of a radial direction (arrow r2 direction), and being a status of clamping the output rod 22. The driving piezoelectric element portion 34, to which the B-phase driving signal 64 is applied, is a status that a displacement is occurred along an elongated direction which is opposite with respect to the supporting member 26 (arrow β1 direction which is a direction to a tip end of the shaft core β). Therefore, a tip end of the output rod 22 acts to a linear direction (arrow β1 direction) at an amount of displacement of the driving piezoelectric element portion 34 elongated and moves to a position X1. During a time T1 to a time T2, a condition shown in FIG. 4(B) continues.

Step (C)

After a status of FIG. 4(B), as shown in FIG. 4(C), the A-phase driving signal 62 becomes a high level voltage value H (positive predetermined voltage value) status and the B-phase driving signal 64 becomes a high level voltage value H (predetermined positive voltage value) status. Since the clamping piezoelectric element portion 32, to which the A-phase driving signal 62 is added, displaces to an outer side of radius direction r1 (arrow r1 direction), and being status not clamping the output rod 22. The driving piezoelectric element portion 34, to which the B-phase driving signal 64 is added, becomes a status that displacement is occurred toward said elongated direction (arrow β1 direction) as it is. Therefore, the tip end of the output rod 22 remains at the position X1 of the STEP (B). During a time T2 to a time T3, a condition shown in FIG. 4(C) continues.

Step (D)

After a status of FIG. 4(C), as shown in FIG. 4(D), the A-phase driving signal 62 becomes a high level voltage value H (positive predetermined voltage value) status and the B-phase driving signal 64 becomes a low level voltage value L (0V) status. Since the clamping piezoelectric element portion 32, to which the A-phase driving signal 62 is added, is being displacement status to the outer side of radius direction (arrow r1 direction), and being status not clamping the output rod 22. The driving piezoelectric element portion 34, to which the B-phase driving signal 64 is added, contracts and back to a status that displacement is not occurred toward the elongated direction, a length of a B shaft core becomes the initial condition. The tip end of the output rod 22 remains at the position X1 as similar to the STEPS (B) and (C). During a time T3 to a time T4, a condition shown in FIG. 4(D) continues.

Step (E)

After a status of FIG. 4(D), as shown in FIG. 4(E), the A-phase driving signal 62 becomes a low level voltage value L (0V) status and the B-phase driving signal 64 becomes a low level voltage value L (0V) status. The clamping piezoelectric element portion 32, to which the A-phase driving signal 62 is added, displaces to the inner side of radius direction (arrow r2 direction), and being status clamping the output rod 22. The driving piezoelectric element portion 34, to which the B-phase driving signal 64 is added, remains a status that displacement is not occurred toward said elongated direction. Therefore, the tip end of the output rod 22 remains at the position X1 of the STEPS (B), (C) and (D). During a time T4 to a time T5, a condition shown in FIG. 4(E) continues. When it becomes a time T5, again it becomes the status of STEP (A) as shown in FIG. 4(A), the above mentioned operation of STEPS (A) to (E) are repeated. As above, by repeating the STEPS (A) to (E), the output rod 22 is driven sequentially to the linear direction (arrow β1 direction).

Note that, in the present embodiment, the clamping piezoelectric element portion 32 becomes a status to hold the output rod 22 constantly, when it is not driven. When disassembling and assembling a lens barrel 4 and the like, applying a positive voltage to the clamping piezoelectric element portion 32 so that an inner circumference is widen condition, the output rod 22 may be removed to the driving portion 24. Also, as the low level voltage value L is not limited to 0V, it may be set to a predetermined voltage value which is lower than the high level voltage value H.

Driving to a reverse direction of the piezoelectric actuator 10 (base end direction β2 of the shaft core β) may be a reverse order of the STEPS (E)→(D)→(C)→(B)→(A) of the above mentioned steps when rectilinear propagation direction (arrow β1) of the STEPS (A)→(B)→(C)→(D)→(E). By repeating the above STEPS (E) to (A), the output rod 22 is driven sequentially to the reverse direction (arrow β2 direction).

A time interval of driving steps may be adjusted by an apparatus to which the piezoelectric actuator 10 is applied and it is not particularly limited. However, by driving an interval of time T0 to T5, which is the STEPS (A) to (E) is one cycle, at a frequency which is higher than 20 kHz in an ultrasonic range by acting each piezoelectric elements can be prevented and extremely quiet driving becomes available.

Also, in case that the output rod 22 is driven to gravity direction and the like, it is preferable that the STEPS (A) to (E) are driven at a frequency which is higher than 20 kHz in an ultrasonic range too. By driving at said frequency, a response of the piezoelectric actuator 10 to the driving portion 24 becomes extremely larger than a response of the output rod 22 to the gravity. Therefore, even the output rod 22 is not clamped as the STEPS (C), (D), effects to the driving by the gravity can be almost avoided.

In the present embodiment, because the clamping piezoelectric elements 36, 38 and the driving piezoelectric elements 40, 42 have annular disc shape and integrally formed by multi stacking respectively, it can be a simple structure and minimized size than conventionally. In addition, because each of electrodes of piezoelectric element is arranged in parallel, the wiring become simple and it makes easy to downsize. Further, by the above mentioned integral shape, connection points of the supporting portion 26 and the piezoelectric elements decrease, extremely accurate assemble is available, further, high accuracy positioning control can be realized.

In the present embodiment, for simplification the clamping piezoelectric element portion 32 and the driving piezoelectric element portion 34 are that the piezoelectric elements are two layered stacking, however, it is possible to multi layered stacking, such as 3 layered, 4 layered, 5 layered and the like. The necessary voltage for the respective piezoelectric element portion at the time of driving can be reduced by multiple layering.

As a piezoelectric element used for the present embodiment, it is not particularly limited, a piezoelectric element having large piezoelectric constants d31, d33 such as PZT and the like are preferable.

In the embodiment, because the output rod 22 is clamped so that the output rod 22 and an outer circumference face 22a are being facing contact by using an inner circumference portion 32a of an annular disc type piezoelectric element, a clamping force becomes stable, and thereby, a large driving force can be given without slipping of the clamp portion to the outer circumference face 22a even a large force is given to a driving direction.

Also, the lens barrel 4 having the piezoelectric actuator 10 of the present embodiment, because a driving force is transmitted from the piezoelectric actuator 10 to the AF lens annulus 14 directly so as to move linearly, loss due to driving force conversion is reduced and an efficiency as a system is improved, compared with the conventional lens barrel wherein a rotational movement of a vibration motor is converted to a translatory movement by a helicoid mechanism.

Note that, in the present embodiment, although the piezoelectric actuator 10 is applied to the lens barrel 4, an application object of the piezoelectric actuator 10 is not limited thereof, the piezoelectric actuator may be applied to other optical equipments or components thereof.

Second Embodiment

Figure 5:
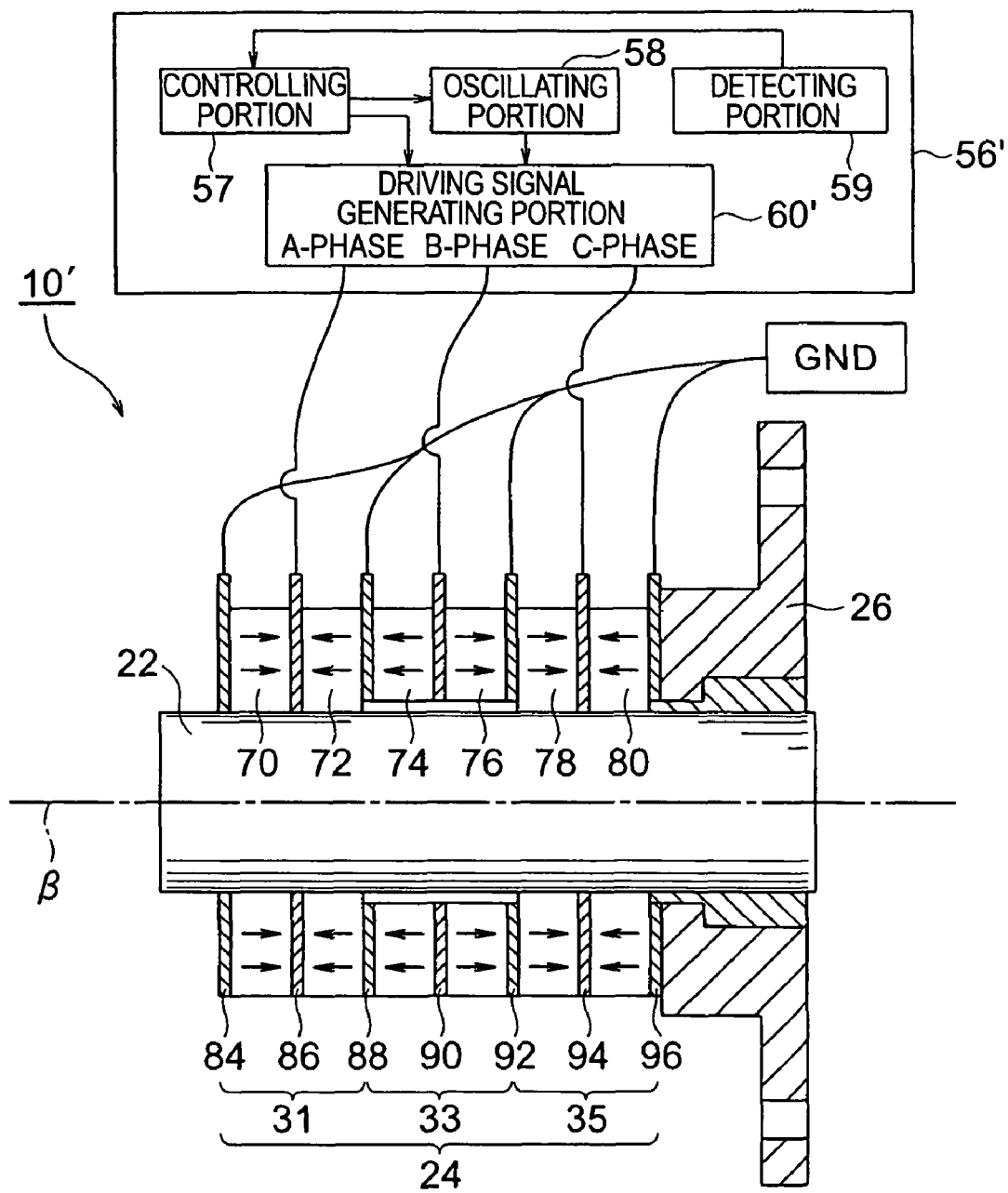
FIG. 5 is a plane view of a main section of a piezoelectric actuator according to a second embodiment of the present invention.

FIG. 5 is an enlarged cross sectional view of a piezoelectric actuator 10' of a second embodiment. A driving portion 24' has a constitution that six sheets of piezoelectric elements are stacked along the shaft core β direction. The driving portion 24' is composed of a first clamping piezoelectric element portion 31 a second clamping piezoelectric element portion 35 which clamp the output rod 22 and release from clamping, and a driving piezoelectric element portion 33 which expands and contracts along the shaft core β direction so as to move the output rod 22, and these are being multiple layered construction from tow sheet of piezoelectric elements, respectively. As mentioned below, in the second embodiment, by providing two kinds of clamping piezoelectric element portions, the output rod 22 can be driven with constantly clamping condition. Other structures other than the driving portion 24' and a driving apparatus 56' relating thereto, a driving signal generating portion 60' and a driving signal have similar to that of the piezoelectric actuator 10 according to the first embodiment.

6 sheets of piezoelectric elements 70 to 80 of the driving portion 24' have annular disc shape, silver electrodes are formed on both surface of two sides. Also, the respective piezoelectric elements 70 to 80 are pre-polarized toward directions shown by arrows of FIG. 5.

Namely, the respective piezoelectric elements 70, 72 of the first clamping piezoelectric element portion 31 are pre-polarized towards a direction from electrodes 84, 88 arranged at both sides of the shaft core β direction to an electrode 86 located at a center portion. Also, with respect to the respective piezoelectric elements 78, 80 of the second clamping piezoelectric element portions 35 are pre-polarized towards a direction from electrodes 92, 96 arranged at both sides of the shaft core β direction to an electrode 94 located at a center portion, as similar to the first piezoelectric element portion 31. Against these, the respective piezoelectric elements 74, 76 of a driving piezoelectric element portions 33 are pre-polarized towards a direction from a electrode 90 arranged at a center portion along the shaft core β direction to electrodes 88, 92 arranged at both sides.

The driving apparatus 56' consists of a controlling portion 57, an oscillating portion 58, a position detecting portion 59 and a driving signal generating portion 60', the controlling portion 57, the oscillating portion 58 and the position detecting portion 59 are similar to that of the first embodiment. The driving signal generating portion 60' inputs a driving signal predetermined constant frequency from the oscillating portion 58, and generates and outputs three driving signals which are different phases. In the present embodiment, these three driving signals are called as an A-phase signal, a B-phase signal, a C-phase signal.

Also, the A-phase driving signal from the driving signal generating portion 60' is input to the electrode 86 located at a center portion of the first clamping piezoelectric element portion 31 along the shaft core β direction. The B-phase driving signal from the driving signal generating portion 60' is input to the electrode 90 located at a center portion of the driving piezoelectric element portion 33 along the shaft core β direction. The C-phase driving signal from the driving signal generating portion 60' is input to the electrode 94 located at a center portion of the second clamping piezoelectric element portion 35 along the shaft core β direction. Also, the electrodes 84, 88, 92, 96 arranged on both sides of the respective piezoelectric elements 31, 33, 35 along the shaft core β direction are grounded.

Figure 6:
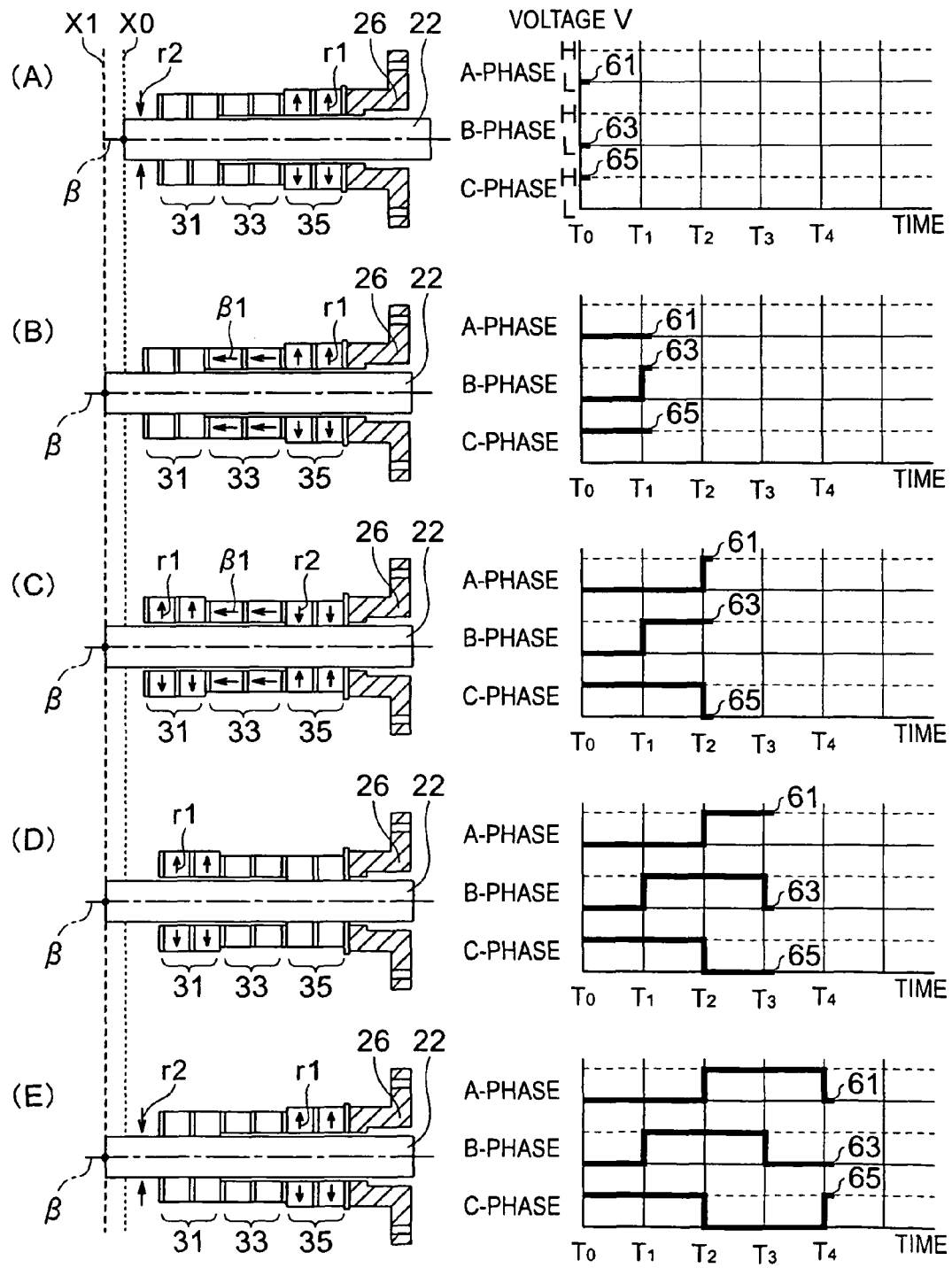
FIG. 6 is schematic views showing one example of controlling by driving signal of a piezoelectric actuator according to a second embodiment of the present invention.

FIG. 6 is a drawing to explain a driving principle of the piezoelectric actuator 10' according to the second embodiment. Driving signals input to each piezoelectric element portions and movement of the output rod 22 will be specified in each step (A) to (E). Each step (A) to (E) corresponds to FIG. 6(A) to FIG. 6(E).

Step (A)

As shown in FIG. 6(A), the A-phase driving signal 61 is a low level voltage value L (0V) status, the B-phase driving signal 63 is a low level voltage value L (0V) status, the C-phase driving signal 65 is a high level voltage value H (predetermined positive voltage) status. The clamping piezoelectric element portion 31, to which the A-phase driving signal 61 is applied, displaces to an inner side of radial direction (arrow r2 direction), and being a status of clamping the output rod 22. The driving piezoelectric element portion 33, to which the B-phase driving signal 63 is applied, is a status that a displacement is not occurred. Since the second clamping piezoelectric element portion 35, to which the C-phase driving signal 65 is added, displaces to an outer side of radius direction r1 (arrow r1 direction), and being status not clamping the output rod 22. The output rod 22 is fixed to the first clamping piezoelectric element portion 33 and is not driven and stayed at the initial position X0. During a time T0 to a time T1, a condition shown in FIG. 6(A) continues.

Step (B)

After a status of FIG. 6(A), as shown in FIG. 6(B), the A-phase driving signal 61 is the low level voltage value L (0V), the B-phase driving signal 63 becomes a high level voltage value H (predetermined positive voltage) status, the C-phase driving signal 65 is a high level voltage value H (predetermined positive voltage) status. The first clamping piezoelectric element portion 31, to which the A-phase driving signal 61 is added, is in a status which is displaced to the inner side of a radial direction (arrow r2 direction), and being a status of clamping the output rod 22. The driving piezoelectric element portion 33, to which the B-phase driving signal 63 is applied, is a status that a displacement is occurred along an elongated direction which is opposite with respect to the supporting member 26 (arrow β1 direction). Since the second clamping piezoelectric element portion 35, to which the C-phase driving signal 65 is added, remains a status that displacement is occurred an outer side of a radial direction (arrow r1 direction), and being status not clamping the output rod 22. Therefore, the output rod 22 acts to a linear direction (arrow β1 direction) at an amount of displacement of the driving piezoelectric element portion 33 and moves to a position X1. During a time T1 to a time T2, a condition shown in FIG. 6(B) continues.

Step (C)

After a status of FIG. 6(B), as shown in FIG. 6(C), the A-phase driving signal 61 becomes a high level voltage value H (positive predetermined voltage value) status and the B-phase driving signal 63 is a high level voltage value H (predetermined positive voltage value) status, the C-phase driving signal 65 becomes a low level voltage value L (0V). Since the first clamping piezoelectric element portion 31, to which the A-phase driving signal 61 is added, displaces to an outer side of radius direction (arrow r1 direction), and being status not clamping the output rod 22. The driving piezoelectric element portion 33, to which the B-phase driving signal 63 is added, remains a status that displacement is occurred towards said elongated direction (arrow β1 direction). The second clamping piezoelectric element portion 35, to which the C-phase driving signal 65 is added, displaces to an inner side of radius direction (arrow r2 direction), and being status clamping the output rod 22. The output rod 22 remains at the position X1 of the STEP (B). During a time T2 to a time T3, a condition shown in FIG. 6(C) continues.

Step (D)

After a status of FIG. 6(C), as shown in FIG. 6(D), the A-phase driving signal 61 is a high level voltage value H (positive predetermined voltage value) status and the B-phase driving signal 63 becomes a low level voltage value L (0V) status, the C-phase driving signal 65 is a low level voltage value L (0V) status. Since the clamping piezoelectric element portion 31, to which the A-phase driving signal 61 is added, is being displacement status to the outer side of radius direction (arrow r1 direction), and being status not clamping the output rod 22. The driving piezoelectric element portion 33, to which the B-phase driving signal 63 is added, contracts and back to a status that displacement is not occurred toward the elongated direction, a length of a B shaft core becomes the initial condition. The second clamping piezoelectric element portion 35, to which the C-phase driving signal 65 is added, displaces to an inner side of radius direction (arrow r2 direction), and being status clamping the output rod 22. The output rod 22 remains at the position X1 as similar to the STEPS (B) and (C). During a time T3 to a time T4, a condition shown in FIG. 4(D) continues.

Step (E)

After a status of FIG. 6(D), as shown in FIG. 6(E), the A-phase driving signal 61 becomes a low level voltage value L (0V) status, the B-phase driving signal 63 is a low level voltage value L (0V) status, the C-phase driving signal 65 becomes a high level voltage value H (positive predetermined voltage value) status. The first clamping piezoelectric element portion 31, to which the A-phase driving signal 61 is added, displaces to the inner side of radius direction (arrow r2 direction), and being status clamping the output rod 22. The driving piezoelectric element portion 33, to which the B-phase driving signal 63 is added, remains a status that displacement is not occurred toward an elongated direction. The second clamping piezoelectric element portion 35, to which the C-phase driving signal 65 is added, displaces to an outer side of the radius direction (arrow r1 direction), and being status not clamping the output rod 22. The output rod 22 remains at the position X1 of the STEPS (B), (C) and (D). During a time T4 to a time T5, a condition shown in FIG. 6(E) continues. When it becomes a time T5, again it becomes the status of STEP (A) as shown in FIG. 6(A), the above mentioned operation of STEPS (A) to (E) are repeated. As above, by repeating the STEPS (A) to (E), the output rod 22 is driven sequentially to the linear direction (arrow β1 direction).

Also, driving to a reverse direction (base end direction β2 of the shaft core β), as similar to the first embodiment, may be a reverse order of the STEPS (E)→(D)→(C)→(B)→(A) of the above mentioned steps when rectilinear propagation direction (arrow β1) of the STEPS (A)→(B)→(C)→(D)→(E).

In the second embodiment, because the output rod 22 is constantly fixed by the first clamping piezoelectric element portion 31 or the second clamping piezoelectric element portion 35, even though a cycle of the driving step (A) to (E) is long, namely, even though frequencies of switching steps are low, effects of an external force such as the gravity can be eliminated. Therefore, the piezoelectric actuator 10' according to the second invention, position controlling of the output rod 22 is available accurately, even in case that the effects of an external force such as the gravity is large.

Third Embodiment

In the above two embodiments, a structure of driving one group of AF lens by using one piezoelectric actuator is explained. However, in a lens barrel having an optical system which is available to move a focal point such as VARI-FOCAL LENSES, when a focal distance is changed, a focal position is changed sometimes. In such VARI-FOCAL LENSES, it is preferable to compose that more than two-group AF lenses are driven, because, if it has the only one group of AF lens driven, an optical system becomes complex and a length of the lens barrel becomes longer.

Figure 7:
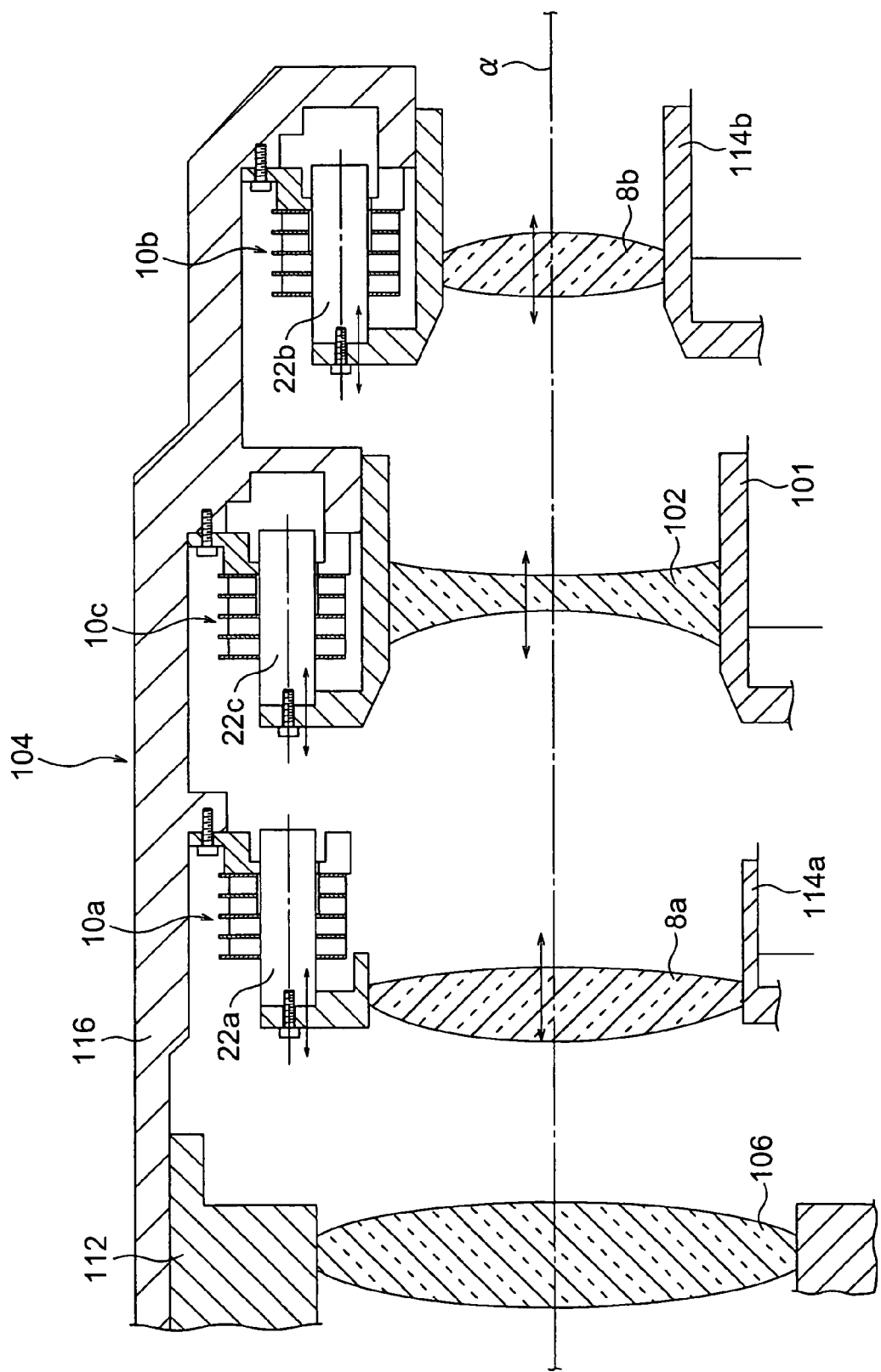
FIG. 7 is a cross sectional view of a main section of a lens barrel comprising a piezoelectric actuator according to a third embodiment of the present invention.

FIG. 7 is a cross sectional view of a main section of a lens barrel comprising a piezoelectric actuator according to a third embodiment of the present invention. In a lens barrel 104 according to the present embodiment, three piezoelectric actuators 10a to 10c are provided.

In the lens barrel 104, a lens 106, a first AF (auto focal) focusing lens 8a, a second AF (auto focal) focusing lens 8b, a variable focal distance lens 102 are located. The lens 106 is fixed on a lens support frame 112, the support frame 112 is movably arranged along an optical axis α of the lens 106 relative to a fixing cylinder 116. The AF focusing lenses 8a, 8b are fixed to AF annulus 114a, 114b, respectively. The AF annulus 114a, 114b are movably arranged to the optical axis α direction relative to the fixing cylinder 116, respectively. The variable focal distance lens 102 is fixed to a variable focal distance annulus 101, the variable focal distance annulus 101 is movably arranged along the optical axis α direction relative to the fixing cylinder 116. The piezoelectric actuators 10a, 10b, 10c are similar to the piezoelectric actuator 10 of the first embodiment respectively, and each of them are fixed on an outer side radius of the AF annulus 114a, 114b, and the variable focal distance annulus 101, and inner side radius of the fixing cylinder 116.

The first piezoelectric actuator 10a is fixed to the fixing cylinder 116 of the lens barrel 104 by a screw. An output rod 22a of the first piezoelectric actuator 10a is fixed to one portion of the AF annulus 114a, to which the first AF focusing lens 8a is equipped, by a screw. When the output rod 22a is moved towards the optical axis α direction, the first AF focusing lens 8a is driven towards the optical axis α direction.

Similarly, the second piezoelectric actuator 10b is fixed to the fixing cylinder 116 of the lens barrel 104 by a screw, too. An output rod 22b of the second piezoelectric actuator 10b is fixed to one portion of the AF annulus 114b, to which the second AF focusing lens 8b is equipped, by a screw. When the output rod 22b is moved towards the optical axis α direction, the second AF focusing lens 8b is driven towards the optical axis α direction.

Similarly, the third piezoelectric actuator 10c is fixed to the fixing cylinder 116 of the lens barrel 104 by a screw, too. An output rod 22c of the third piezoelectric actuator 10c is fixed to one portion of the variable focal distance annulus 101 by a screw. When the output rod 22c is moved towards the optical axis α direction, the variable focus distance lens 102 is driven towards the optical axis α direction.

Figure 8:
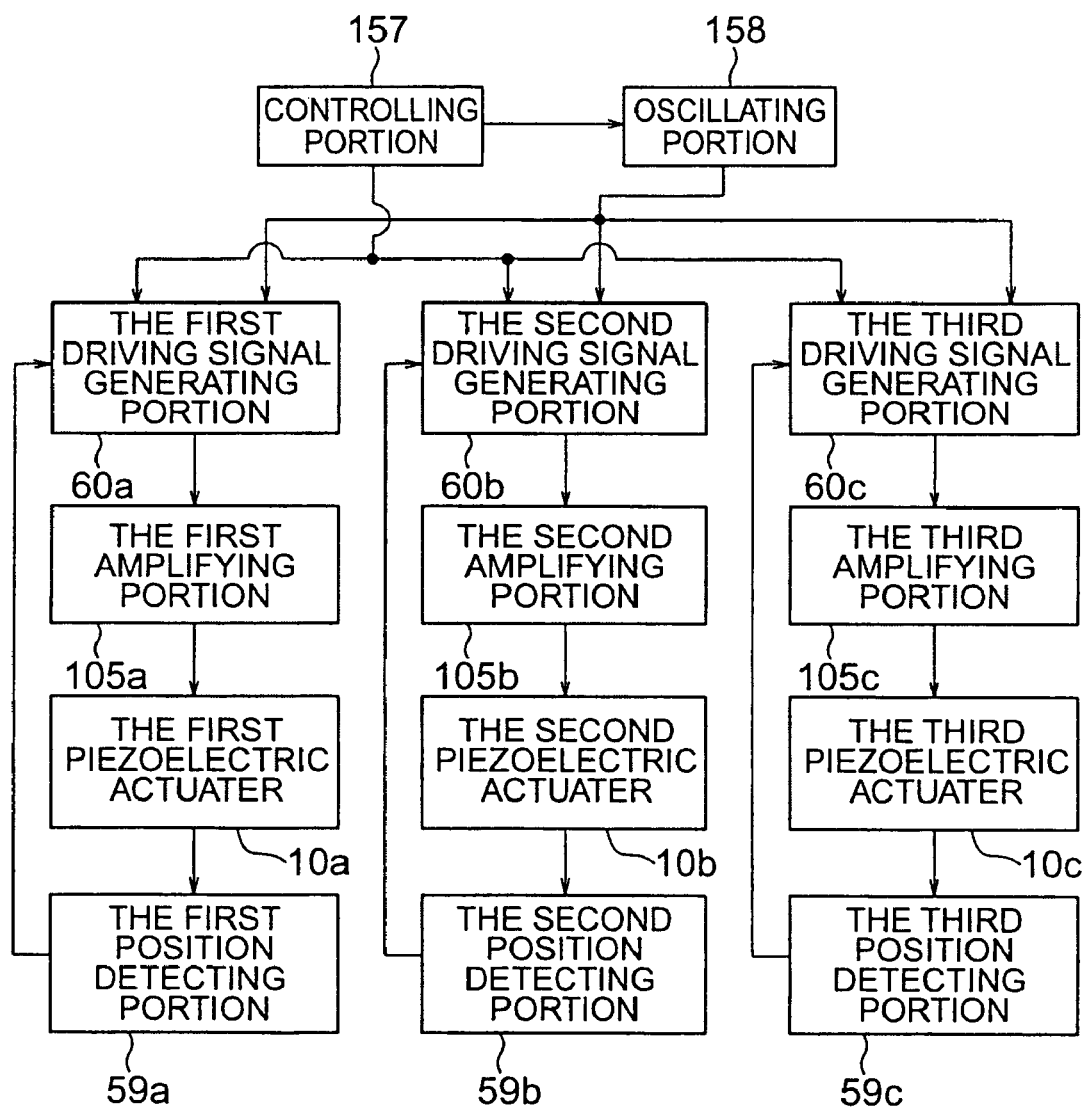
FIG. 8 is a block diagram showing a constitution of a driving apparatus for a piezoelectric actuator in a lens barrel according to a third embodiment of the present invention.

FIG. 8 is a block diagram showing a constitution of a driving apparatus for a piezoelectric actuator in a lens barrel according to a third embodiment of the lens barrel.

A driving apparatus generates driving signals for driving the piezoelectric actuators 10a, 10b, 10c and outputs to the piezoelectric actuators 10a, 10b, 10c. An oscillating portion 158 generates a predetermined frequency driving signal by a command of a controlling portion 157.

The first driving signal generating portion 60a divides a driving signal from the oscillation portion 157 into two driving signal having different phase and outputs. A first amplifying portion 105a amplifies the two driving signal output from the first driving signal generating portion 60a and outputs Namely, voltage values of the two driving signal are boosted as being predetermined voltage value.

Figure 2:
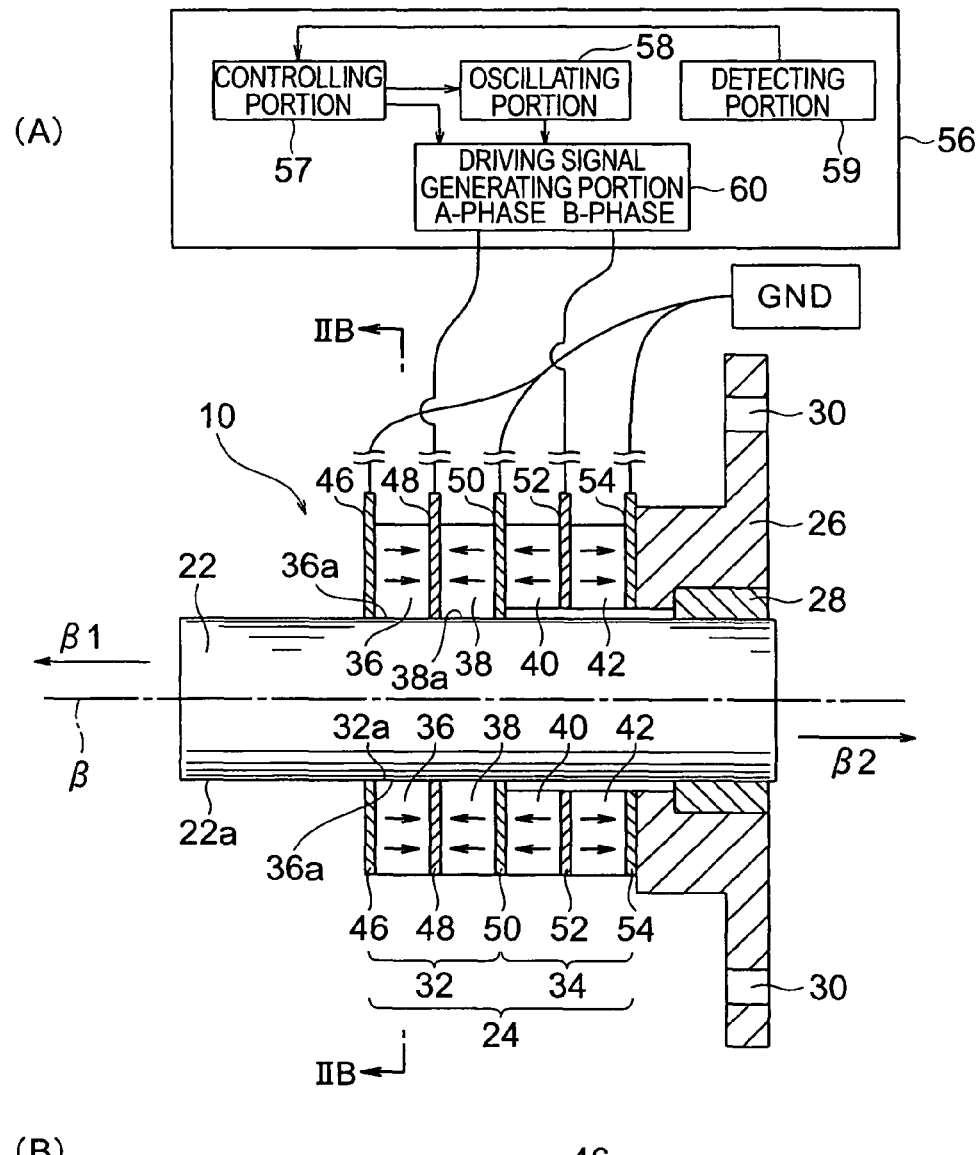
FIG. 2 is a cross sectional view and a main section plane view of a piezoelectric actuator according to a first embodiment of the present invention.
Figure 2:
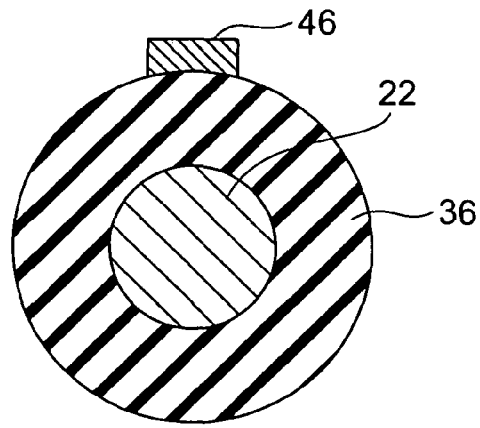

As specified in the first embodiment, the two generated driving signals (the A-phase driving signal, the B-phase driving signal) are respectively used a driving signal to drive the clamping piezoelectric element of the first piezoelectric actuator 10a (corresponding to the clamping piezoelectric element portion 32 of FIG. 2), a driving signal to drive the driving piezoelectric element (corresponding to the driving piezoelectric element portion 32 of FIG. 2). Then, driving of the first piezoelectric actuator 10a is controlled on the basis of driving commands from the controlling portion 157.

A first position detecting portion 59a is composed of a linear type encoder (optical encoder, magnetic encoder) and the like, and detects position or velocity of the output rod 22a towards the optical axis α direction. A detecting signal is output to the controlling portion 157, the first driving signal generating portion 60a. The first driving signal generating portion 60a obtains positional information and velocity information of the output rod 22a from the detecting signal thereof, and controls the output of the driving signal so as to determine a position of the output rod 22a to an object position.

Similarly, the second driving signal generating portion 60b divides a driving signal from the oscillation portion 158 into two driving signal having different phase and outputs the respective driving signals to a clamping piezoelectric element and a driving piezoelectric element of the second piezoelectric actuator 10b and controls the second piezoelectric actuator 10b driving. A second amplifying portion 105b, a second position detecting portion 59b are similar to the first amplifying portion 105a, the first position detecting portion 59a. The second amplifying portion 105b amplifies two driving signal from the second driving signal generating portion 60b and outputs, the second position detecting portion 59b detects position or velocity of the output rod 22b of the piezoelectric actuator 10b towards the optical axis α direction and outputs the detection signals to the controlling portion 157 and the second driving signal generating portion 60b. The second driving signal generating portion 60b obtains positional information and velocity information of the output rod 22b, and controls the output of the driving signal so as to determine a position of the output rod 22b to an object position.

Similarly, the third driving signal generating portion 60c divides a driving signal from the oscillation portion 158 into two driving signal having different phase and outputs the respective driving signals to a clamping piezoelectric element and a driving piezoelectric element of the second piezoelectric actuator 10c and controls the second piezoelectric actuator 10c driving. A third amplifying portion 105c, a third position detecting portion 59c are similar to the first amplifying portion 105a, the first position detecting portion 59a. The third amplifying portion 105c amplifies two driving signal from the third driving signal generating portion 60c and outputs, the third position detecting portion 59c detects position or velocity of the output rod 22c of the piezoelectric actuator 10c towards the optical axis α direction and outputs the detection signals to the controlling portion 157 and the third driving signal generating portion 60c. The third driving signal generating portion 60c obtains positional information and velocity information of the output rod 22c, and controls the output of the driving signal so as to determine a position of the output rod 22c to an object position.

Below, the operation of the piezoelectric actuator of the present embodiment is specified.

Firstly, driving commands are transmitted from a camera body side to the controlling portion 157, target driving amounts for the respective piezoelectric actuators 10a, 10b, 10c are instructed to the first driving signal generating portion 60a, the second driving signal generating portion 60b, the third driving signal generating portion 60c. Specifically, based on a driving amount of the variable focal distance lens 102 transmitted to the controlling portion 157 (namely, a driving amount of the third piezoelectric actuator 10c), the controlling portion 157 evaluates a driving amount of the first AF lens 8a (namely, a driving amount of the first piezoelectric actuator 10a) and a driving amount of the second AF lens 8b (namely, a driving amount of the second piezoelectric actuator 10b). Then, the controlling portion 157 transmits the evaluated driving amounts of the respective piezoelectric actuator to the corresponding driving signal generating portion 60a to 60c.

An original signal of the driving signals is output from the oscillation portion 158, the original driving signal is input to the first driving signal generating portion 60a, the second driving signal generating portion 60b, the third driving signal generating portion 60c, respectively. Then, respective the first driving signal generating portion 60a, the second driving signal generating portion 60b, the third driving signal generating portion 60c generate two driving signals having different phases from the input driving signal, and outputs to the first amplifying portion 105a, the second amplifying portion 105b, the third amplifying portion 105c. The respective two driving signals are amplified as being predetermined voltage values by the first amplifying portion 105a, the second amplifying portion 105b, the third amplifying portion 105c, and are output to each of corresponding piezoelectric actuators (10a to 10c). Then, the piezoelectric actuators 10a to 10c are driven.

When the respective output rod 22a to 22c of the piezoelectric actuators 10a to 10c are driven, the output signals from the first position detecting portion 59a, the second position detecting portion 59b, the third position detecting portion 59c are input to the first driving signal generating portion 60a, the second driving signal generating portion 60b, the third driving signal generating portion 60c, respectively. The first driving signal generating portion 60a, the second driving signal generating portion 60b, the third driving signal generating portion 60c obtain the present positional information and the present velocity information of the output rods 22a to 22c on the basis of the respective input detected signal. Then, from these positional information and the velocity information and target positional information, driving amounts of the first piezoelectric actuator 10a, the second piezoelectric actuator 10b, the third piezoelectric actuator 10c are controlled. Then, the output of the driving signal is ceased when the output rods 22a to 22c are determined as they reached to target positions. The stopping timing of the driving signals are different depend on the driving amounts the respective piezoelectric actuators 10a to 10c, and are determined by the first driving signal generating portion 60a, the second driving signal generating portion 60b, the third driving signal generating portion 60c, respectively.

The first driving signal generating portion 60a, the second driving signal generating portion 60b, the third driving signal generating portion 60c transmit information showing driving controlling is finished, to the controlling portion 157, when the respective corresponding piezoelectric actuator are stop. When the controlling portion 157 receives the signal showing the driving controlling is finished from whole the first driving signal generating portion 60a, the second driving signal generating portion 60b, the third driving signal generating portion 60c, the controlling portion 157 determines the output rods of the whole piezoelectric actuator are reached to the target positions, and outputs a command to stop generating the driving signal.

In the present embodiment, frequencies output from the first driving signal generating portion 60a, the second driving signal generating portion 60b, the third driving signal generating portion 60c may be an identical. In the case of changing driving speeds of the respective output rods, it is possible to respond by changing voltage values of the driving signals without changing frequencies of the driving signals. When the voltage values of the driving signals are set as high, displacement amount of the piezoelectric element within one cycle becomes larger, and the displacement of the output rod within one cycle can be larger. Therefore, the displacement within a predetermined period can be enlarged and the driving speed can be faster. In order to make the voltage value of the driving signal is higher, amplifying ratios at the first amplifying portion 105a, the second amplifying portion 105b, the third amplifying portion 105c may be increased.

Amplifying ratios of the first amplifying portion 105a, the second amplifying portion 105b, and the third amplifying portion 105c are may be set as individually. For example, in case that the driving amount of the second piezoelectric actuator 10b is larger than the first piezoelectric actuator 10a, in order to finish the driving within a same time, the voltage vale of the driving signal of the second piezoelectric actuator 10b may be increased. Namely, the amplifying ratio of the second amplifying portion 105b may be increased than the first amplifying portion 105a. Such changing setting of the amplifying ratio are conducted by the driving signal generating portion 60a to 60c corresponding respectively to the amplifying portions 105a to 105c. Also, changing the voltage value of the driving signals may be made by changing voltage vale to be output from the respective driving signal generating portion 60a to 60c.

The piezoelectric actuators in the present embodiment as above are compact type, in a lens barrel of VARI-FOCAL lenses wherein a plurality of the piezoelectric actuators must be equipped, it is easy to equip thereof. Then, by controlling the plurality of the piezoelectric actuators at the same time, driving of the variable focal distance lens and the AF focal lens can be made at the same time. Also, since the piezoelectric actuator of the present embodiment can be smaller individual size differences than these of the conventional vibration actuators, the driving signals for the respective piezoelectric actuator can be common, according to the present embodiment.

A driving electric current of the piezoelectric actuator according to the present embodiment is smaller than DC motor. Therefore, in case of using a plurality of DC motors, as a counter measure to large starting electric current, it is necessary to increase power capacity and to eliminate simultaneous activation of these motors. However, in the present embodiment, it is not necessary such the counter measures.

Also, the piezoelectric actuator of the present embodiment is easy to control with respect to s stepping motor. In case of the stepping motor, when driving at a high speed, a special controlling considering an inertia is needed, the control becomes complex. Also, it is difficult to control the speed. The piezoelectric actuator of the present embodiment, it is possible to drive accurately by simple controlling.

The invention claimed is:

1. A piezoelectric actuator comprising:
    a first piezoelectric element pre-polarized along a first direction and displaceable along a direction substantially perpendicular to said first direction;
    a second piezoelectric element pre-polarized along a direction substantially parallel to said first direction and displaceable along a direction substantially parallel to said first direction;
    a supporting portion to support said second piezoelectric element;
    a relative moving member clamped by displacement of said first piezoelectric element and relatively moved to said supporting portion by displacement of said second piezoelectric element;
    an electrode configured to apply a voltage to said first piezoelectric element and said second piezoelectric element and arranged between said first piezoelectric element and said second piezoelectric element; and
    a positioning portion configured to position said relative moving member at a radial direction and attached to said supporting portion, wherein
    said first piezoelectric element is associated with one end of said second piezoelectric element and said supporting portion is associated with an other end of said second piezoelectric element so that said first piezoelectric element, said second piezoelectric element and said supporting portion are located in this sequence along said first direction, said relative moving member is movably positioned by said positioning portion at a position detached from said first piezoelectric element toward said first direction.

2. The piezoelectric actuator as set forth in claim 1, wherein:
    said first piezoelectric element and said second piezoelectric element are integrally layered along said first direction via said electrode.

3. The piezoelectric actuator as set forth in claim 1, wherein:
    said relative moving member relatively moves along a direction substantially parallel to said first direction.

4. The piezoelectric actuator as set forth in claim 1, wherein:
    said first piezoelectric element and said second piezoelectric element have an annular disc shape, said relative moving member is provided in a hollow part of said annular disc shape, said first direction is a direction perpendicular to a radial direction of said annular disc shape.

5. The piezoelectric actuator as set forth in claim 1 comprising:
    a driving signal controlling portion connected with said first piezoelectric element and said second piezoelectric element to output driving signals to said first piezoelectric element and said second piezoelectric element, wherein:
    said driving signal controlling portion outputs said driving signal to control so as to move said relative movement by displacing said second piezoelectric element, with a status of clamping said relative moving by displacing said first piezoelectric element.

6. The piezoelectric actuator as set forth in claim 1 comprising:
    a driving signal controlling portion connected with said first piezoelectric element and said second piezoelectric element to output driving signals to said first piezoelectric element and said second piezoelectric element, wherein:
    said driving signal controlling portion outputs a first driving signal for clamping said relative moving member by displacing said first piezoelectric, and a second driving signal for moving said relative moving member by displacing said second piezoelectric element, and
    said first driving signal and phase of said second driving signal are different in phases.

7. The piezoelectric actuator as set forth in claim 6, wherein:
    said first driving signal and said second driving signal have equal frequency.

8. A piezoelectric actuator comprising:
    a first piezoelectric element pre-polarized along a first direction and displaceable along a direction substantially perpendicular to said first direction;

a second piezoelectric element pre-polarized along a direction substantially parallel to said first direction and displaceable along a direction substantially parallel to said first direction;

a third piezoelectric element provided in the same row along said first direction opposite to said first piezoelectric element with respect to said second piezoelectric element, wherein:

said third piezoelectric element is pre-polarized along the first direction and displaceable along a direction substantially perpendicular to said first direction;

a supporting portion to support said third piezoelectric element;

a relative moving member clamped by displacement of said first piezoelectric element and relatively moved to said supporting portion by displacement of said second piezoelectric element;

an electrode configured to apply a voltage to said first piezoelectric element and said second piezoelectric element and arranged between said first piezoelectric element and said second piezoelectric element; and a positioning portion configured to position said relative moving member at a radial direction and attached to said supporting portion, wherein said first piezoelectric element is associated with one end of said second piezoelectric element and said supporting portion is associated with an other end of said second piezoelectric element through contact with said third piezoelectric elements so that said first piezoelectric element, said second piezoelectric element, said third piezoelectric element and said supporting portion are located in this sequence along said first direction, said relative moving member is movably positioned by said positioning portion at a position detached from said first piezoelectric element toward said first direction.

9. The piezoelectric actuator as set forth in claim 8 comprising:

a driving signal controlling portion which outputs driving signals to said first piezoelectric element, said second piezoelectric element and said third piezoelectric element, wherein:

said driving signal controlling portion continuously operates controlling to move said relative movement member by displacing said second piezoelectric element with a status of clamping said relative moving member by displacing said first piezoelectric element, and to displace said second piezoelectric element with a status of clamping said relative moving member by displacing said third piezoelectric element.

10. The piezoelectric actuator as set forth in claim 8 comprising:

a driving signal controlling portion which outputs driving signals to said first piezoelectric element, said second piezoelectric element and said third piezoelectric element, wherein:

said driving signal controlling portion outputs a first driving signal for clamping said relative moving member by displacing said first piezoelectric element, a second driving signal for moving said relative moving member by displacing said second piezoelectric element and a third driving signal for clamping said relative moving member by displacing said third piezoelectric element, and said first driving signal, said second driving signal and said third driving signal are different in phases, respectively.

11. The piezoelectric actuator as set forth in claim 10, wherein;

said first driving signal, said second driving signal and said third driving signal have equal frequency.

12. The piezoelectric actuator as set forth in claim 1, wherein:

a displacement amount of said first piezoelectric element along a direction substantially perpendicular to said first direction is larger than that along said first direction, a displacement amount of said second piezoelectric element along said first direction is larger than that along a direction substantially perpendicular to said first direction.

13. The piezoelectric actuator as set forth in claim 8, wherein:

displacement amounts of said first piezoelectric element and said third piezoelectric element along a direction substantially perpendicular to said first direction are larger than that along said first direction, a displace amount of said second piezoelectric element along said first direction is larger than that along a direction substantially perpendicular to said first direction.

14. A piezoelectric actuator device comprising:

a plurality of piezoelectric actuators as set forth in claim 1;

a first driving signal generating portion which outputs a first driving signal to a first piezoelectric actuator among said plurality of piezoelectric actuators;

a second driving signal generating portion which outputs a second driving signal to a second piezoelectric actuator among said plurality of piezoelectric actuators.

15. The piezoelectric actuator device as set forth in claim 14, wherein:

said first driving signal and said second driving signal are equal in frequency, at least one of said first driving signal generating portion and said second driving signal generating portion is available to make different voltage levels of said first driving signal and said second driving signal.

16. A lens barrel comprising:

the piezoelectric actuator as set forth in claim 1; and a lens which moves in response to a relative movement of said relative moving member.

17. The lens barrel as set forth in claim 16, wherein:

said lens moves along an identical direction of movement of said relative moving member.

18. An optical equipment comprising:

the piezoelectric actuator as set forth in claim 1; and an optical member which moves in response to relative movement of said relative moving member.

19. The optical equipment as set forth in claim 18, wherein:

said optical member moves along an identical direction of moving direction of said relative movable member.

20. A method for manufacturing piezoelectric actuator device comprising:

providing a plurality of piezoelectric actuators as set forth in claim 1;

providing a first driving signal generating portion to output a first driving signal to a first piezoelectric actuator among said plurality of piezoelectric actuators; and providing a second driving signal generating portion to output a second driving signal to a second piezoelectric actuator of said plurality of piezoelectric actuators.

21. The method for manufacturing piezoelectric actuator as set forth in claim 20, wherein:

said first driving signal and said second driving signal are equal in frequency, at least one of said first driving signal generating portion and said second driving signal generating portion is available to make different voltage levels of said first driving signal and said second driving signal.

22. A method for manufacturing lens barrel comprising:
  providing a piezoelectric actuator as set forth in claim 1; and
  providing a lens which moves in response to a relative movement of said relative moving member.

23. The method for manufacturing lens barrel as set forth in claim 22, wherein:
  said lens moves along an identical direction of movement of said relative moving member.

24. A method for manufacturing optical equipment comprising:
  providing a piezoelectric actuator as set forth in claim 1;
  providing an optical member which moves in response to a relative movement of said relative moving member.

25. The method for manufacturing optical equipment as set forth in claim 24, wherein:
  said lens moves along an identical direction of movement of said relative moving member.

26. The piezoelectric actuator as set forth in claim 1, wherein:
  said first piezoelectric element and said second piezoelectric element have a plurality of disc elements, each of said disc elements are alternately coupled with electrodes.

27. The piezoelectric actuator as set forth in claim 1, wherein the electrode is of an annular disc shape extending in the direction substantially perpendicular to the first direction.

28. The piezoelectric actuator as set forth in claim 8, wherein the electrode is of an annular disc shape extending in the direction substantially perpendicular to the first direction.

* * * * *